(12) United States Patent
Straub et al.

(10) Patent No.: US 10,222,609 B2
(45) Date of Patent: Mar. 5, 2019

(54) MICROMIRROR ARRANGEMENT AND PROJECTION DEVICE

(71) Applicant: Robert Bosch GmbH, Stuttgart (DE)

(72) Inventors: Rainer Straub, Ammerbuch (DE); Stefan Pinter, Reutlingen (DE); Johannes Baader, Freiburg (DE); Andreas Duell, Stuttgart (DE); Frederic Njikam Njimonzie, Reutlingen (DE); Joerg Muchow, Reutlingen (DE); Helmut Grutzeck, Kusterdingen (DE); Stefan Mark, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/318,523

(22) PCT Filed: May 29, 2015

(86) PCT No.: PCT/EP2015/061955
§ 371 (c)(1),
(2) Date: Dec. 13, 2016

(87) PCT Pub. No.: WO2015/189048
PCT Pub. Date: Dec. 17, 2015

(65) Prior Publication Data
US 2017/0146792 A1 May 25, 2017

(30) Foreign Application Priority Data
Jun. 13, 2014 (DE) .......... 10 2014 211 338

(51) Int. Cl.
G02B 26/00 (2006.01)
G02B 26/08 (2006.01)
(Continued)

(52) U.S. Cl.
CPC ............ *G02B 26/085* (2013.01); *B81B 3/004* (2013.01); *B81B 3/0051* (2013.01);
(Continued)

(58) Field of Classification Search
CPC .................................................... G02B 26/085
(Continued)

(56) References Cited

U.S. PATENT DOCUMENTS

| 2002/0017563 | A1* | 2/2002 | Tokuda | ............... G06K 7/10 |
| | | | | 235/454 |
| 2011/0188104 | A1* | 8/2011 | Tachibana | ............ B81B 3/0051 |
| | | | | 359/199.2 |

FOREIGN PATENT DOCUMENTS

| CN | 101135775 A | 3/2008 |
| CN | 101281295 A | 10/2008 |
| DE | 102010064218 A1 | 6/2012 |

OTHER PUBLICATIONS

International Search Report for PCT/EP2015/061955, dated Aug. 6, 2015.

\* cited by examiner

*Primary Examiner* — James Jones
(74) *Attorney, Agent, or Firm* — Norton Rose Fulbright US LLP; Gerard Messina

(57) ABSTRACT

A micromirror assembly is described as including a spring-mounted mirror and at least one stop unit, which is designed to restrict a movement of the mirror in the event of a movement of the mirror in a predefined direction out of its idle position. Furthermore, the invention relates to a projection device.

20 Claims, 5 Drawing Sheets

(51) Int. Cl.
  *B81B 3/00* (2006.01)
  *G02B 26/10* (2006.01)
  *H04N 9/31* (2006.01)
(52) U.S. Cl.
  CPC ........... *G02B 26/105* (2013.01); *H04N 9/312* (2013.01); *B81B 2201/042* (2013.01)
(58) Field of Classification Search
  USPC .................................................. 359/290–292
  See application file for complete search history.

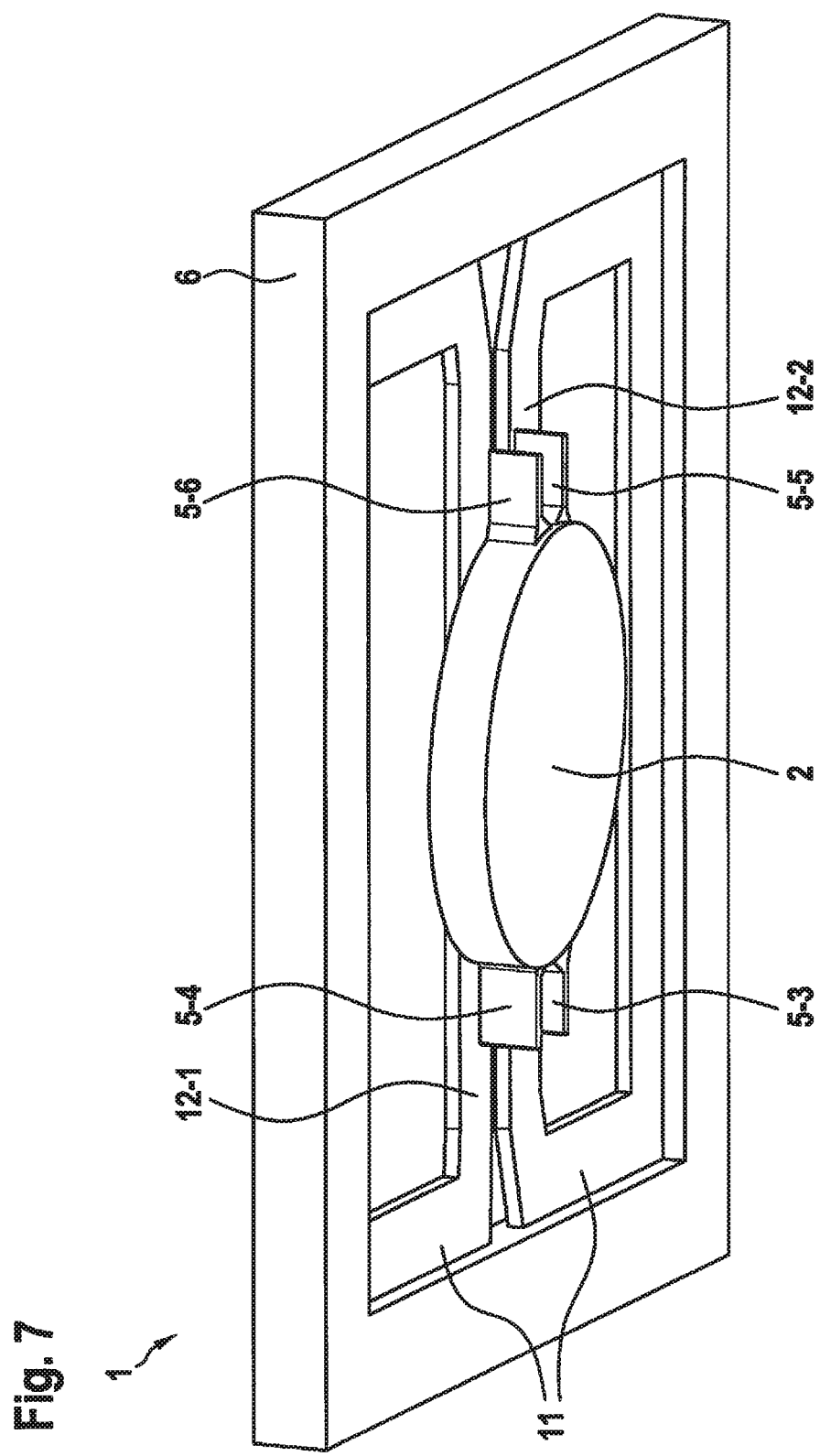

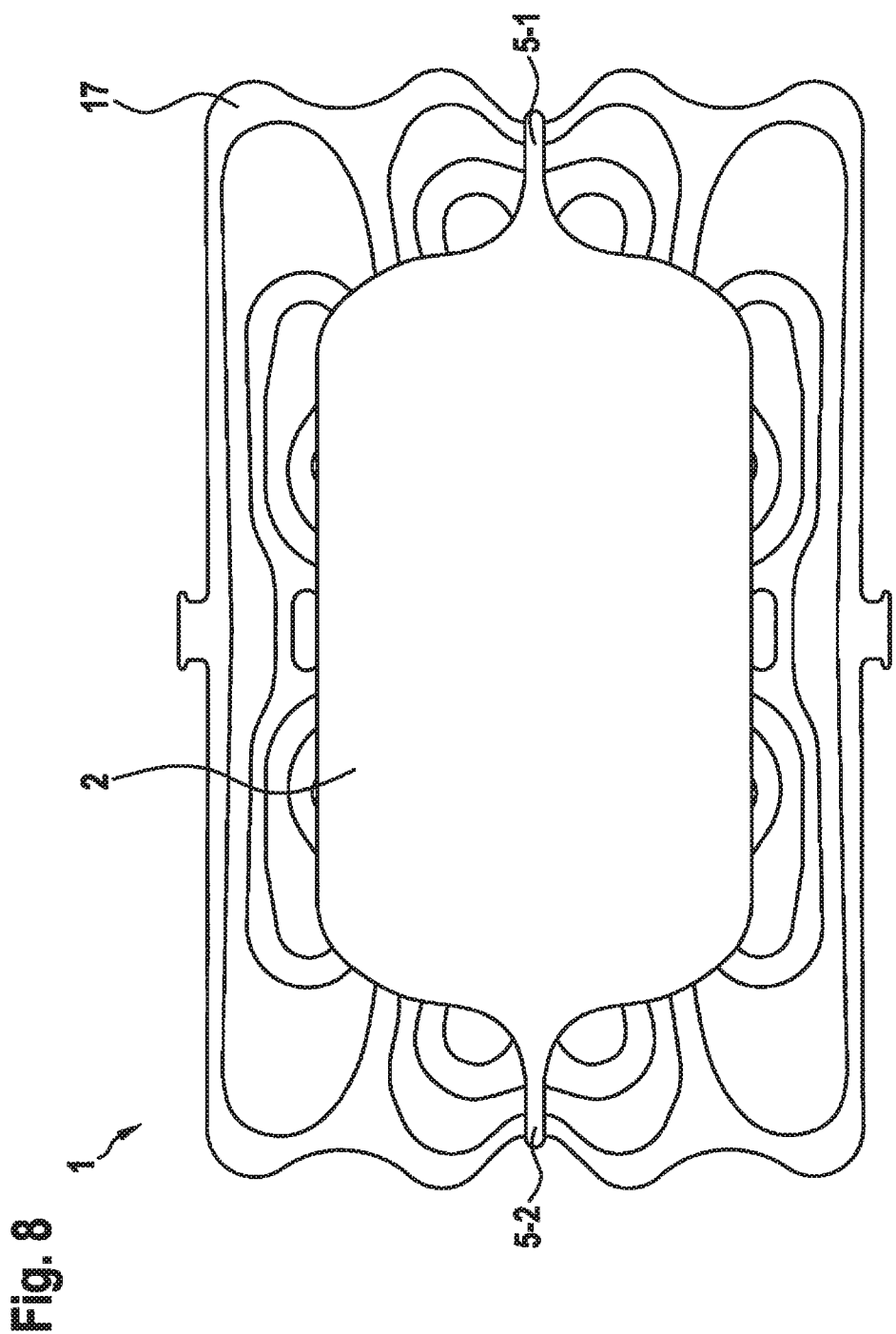

MICROMIRROR ARRANGEMENT AND PROJECTION DEVICE

FIELD OF THE INVENTION

The present invention relates to a micromirror assembly and a projection device including a micromirror assembly according to the present invention.

BACKGROUND INFORMATION

Micromirrors are presently used in a continuously increasing number of applications. These applications include, for example, projectors, scanners, or the like. The advantage of the micromirrors is that they occupy little space and may therefore be used very flexibly.

Micromirrors are typically micro-electromechanical elements which are structured and manufactured, for example, with the aid of the methods known from semiconductor processing.

Different methods may be used to implement the deflection of the mirrors in such a micromirror. For example, electrostatic drive methods, magnetic drive methods, piezoelectric drive methods, or the like may be used. Some drive methods only offer the option of tilting the mirror in one direction. Other drive methods also offer the option of tilting the mirror in two directions.

During rapid movements of the mirror, a deformation thereof may occur. Since the mirror is typically formed as a silver layer, which is applied to a silicon layer, a deformation may also occur in the event of a thermal strain of the mirror as a result of the different coefficients of expansion.

To avoid this, the silicon layer may be made significantly thicker than the silver layer. However, the mass of the mirror is thus significantly increased.

In the event of a fall of the micromirror, it is therefore possible that upon an impact of the mirror, as a result of the high mass inertia of the mirror, these or other elements, which support or hold the mirror, may be damaged.

The micromirror is destroyed and cannot be used further due to a fracture, for example, of a spring of the micromirror or a suspension of the mirror in the micromirror. This is to be avoided.

A known micromirror is described, for example, in German Published Patent Application No. 10 2010 064 218.

SUMMARY

The present invention provides a micromirror assembly and a projection device.

The following is accordingly provided:

A micromirror assembly including a spring-mounted mirror and at least one stop unit, which is designed to restrict the movement of the mirror in the event of a movement of the mirror in a predefined direction out of its idle position.

The following is furthermore provided:

A projection device including at least one light source, at least one micromirror assembly according to the present invention, and a control unit, which is designed to control the at least one micromirror assembly.

Advantages of the Invention

The finding on which the present invention is based is that an excessively large freedom of movement of the mirror of a micromirror assembly results in an increased risk of fracture of components of the micromirror assembly in the event of a strong acceleration of the micromirror assembly, for example, in the event of a fall.

The concept on which the present invention is based is to take this finding into consideration and to provide an option for restricting the movement of the micromirror, in particular in a predefined direction.

The predefined direction may be, for example, a direction in which the mirror without the stop unit according to the present invention has a greater freedom of movement than in other directions, i.e., the direction in which the mirror mass may absorb the greatest kinetic energy.

Because the movement is restricted in the predefined direction by the stop unit, the stability of the micromirror assembly may be increased and its ruggedness in a fall or a shock, for example, may be increased.

In one specific embodiment, the stop unit has at least one stop coupled to the mirror and at least one counter bearing, which is coupled to a housing of the micromirror assembly in particular. If the at least one stop is connected to the mirror, this has the advantage that the large mass having the greatest kinetic energy is slowed down directly, without weak intermediate pieces having to absorb the energy, which would result in great stresses of these intermediate pieces. If the counter bearing forms the housing of the micromirror assembly itself, the entire stop structure may be very stable.

In one specific embodiment, the predefined direction is designed as the direction of the normal vector of a plane in which the mirror is situated in the idle position. Since it is required for the function of the mirror—it is tilted in relation to the normal vector for beam deflection—that it is rotated out of the plane in the direction of the normal vector at least in the outer areas, the mirror has the greatest freedom of movement in the direction of the normal vector of the plane in which the mirror is situated. One specific embodiment of the stop structure therefore retains the mirror on the axis of rotation, since only at this point no movement out of the plane takes place. If the stop is designed in such a way that it restricts the movement of the mirror in precisely this direction, damage to the micromirror assembly may be effectively prevented.

In one specific embodiment, the micromirror assembly has at least one torsion spring, which is designed to spring-mount the mirror, the at least one torsion spring being situated in particular in the axis of rotation of the mirror or in a parallel axis to the axis of rotation of the mirror below the mirror. Below the mirror means that the spring is situated on that side of the mirror which does not have the reflective surface of the mirror. Springs may thus be formed extending very far below the mirror, whereby the existing space is optimally utilized.

In one specific embodiment, one stop is situated in each case proceeding from the edge of the mirror along a parallel extending through the mirror to the axis of rotation of the mirror, the stops being situated at a predefined distance from the at least one torsion spring. In this specific embodiment, springs and stops are situated congruently one below the other when the mirror is viewed from the front, i.e., in a top view onto the mirror surface. This enables stops to be provided which do not interfere with or negatively influence the movement of the springs.

In one specific embodiment, the micromirror assembly includes a drive frame, which has at least two rails, which are situated on both sides adjacent to the at least one torsion spring below the mirror. Furthermore, at least two stops are situated in each case proceeding from the edge of the mirror along a parallel extending through the mirror to the axis of rotation of the mirror and an axis of symmetry of the at least two stops is situated in each case on the parallels extending through the mirror to the axis of rotation of the mirror and one of the stops is mechanically coupled to one of the rails in each case. This enables simple manufacturing of the stops, since they may be formed in one piece with the rails and no manufacturing step is required in which a separation between rails and stops has to be established, for example, by undercutting the stops, as is necessary if only one stop is situated above a particular spring.

In one specific embodiment, the stops and the mirror are formed in one piece from a substrate, in particular a silicon substrate. This enables simple manufacturing of the mirror and the stops.

In one specific embodiment, the counter bearing is designed as an optical base of the micromirror assembly. Since the optical base is an advantageous component of a micromirror assembly, a counter bearing may thus be provided for which no further elements or manufacturing steps are required. The mirror is protected against scratches, particles, and corrosion by the optical base. A vacuum may be enclosed or foreign gas may optionally be used.

In one specific embodiment, the counter bearing is situated on the micromirror assembly in such a way that the distance between the stops and the counter bearing in the predefined direction is less than 100 µm, in particular less than 50 µm. If the movement in the predefined direction is restricted to less than 100 µm, the acceleration path is also restricted to this value and, in the event of an impact of the stops on the counter bearing, less kinetic energy has to be dissipated.

In one specific embodiment, the counter bearing is situated on the micromirror assembly in such a way that the counter bearing and the mirror are situated flush in one plane, in the area of the stops, the counter bearing having a recess in the predefined direction of a thickness of less than 100 µm, in particular less than 50 µm. If mirror and counter bearing are situated in one plane, the light flow to the mirror is optimized. The freedom of movement of the mirror may also be exactly set laterally in the mirror plane by way of a recess in the counter bearing.

In one specific embodiment, the at least one stop coupled to the mirror is coupled to the mirror set back in the predefined direction in relation to the mirror in such a way that the distance between the stops and the counter bearing in the predefined direction is less than 100 µm, in particular less than 50 µm. Mirror and stops may be manufactured in one piece in one plane, for example, in an etching procedure. The setting back of the stops may be carried out, for example, by a second etching procedure, for example, trench etching. This also enables the freedom of movement of the mirror to be exactly set in the predefined direction.

In one specific embodiment, the micromirror assembly is designed as a quasistatic micromirror assembly. In another specific embodiment, the micromirror assembly is designed as a resonant micromirror assembly. This enables the present invention to be used with a variety of different micromirror assemblies.

The above embodiments and refinements may be combined with one another arbitrarily whenever reasonable. Further possible embodiments, refinements, and implementations of the present invention also include combinations, which are not mentioned explicitly, of features of the present invention described above or hereafter with respect to the exemplary embodiments. In particular, those skilled in the art will also add individual aspects as improvements or supplementations to the particular basic form of the present invention.

BRIEF DESCRIPTION OF THE DRAWINGS

FIG. 7 shows a schematic view of another specific embodiment of a micromirror assembly according to the present invention.

FIG. 8 shows a schematic view of another specific embodiment of a micromirror assembly according to the present invention.

DETAILED DESCRIPTION

Figure 1:
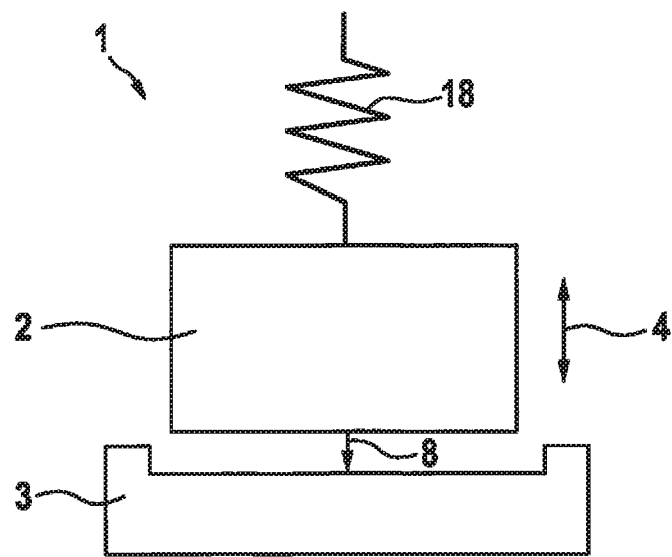
FIG. 1 shows a block diagram of one specific embodiment of a micromirror assembly according to the present invention.

In all figures, identical or functionally identical elements and devices—if not otherwise indicated—have been provided with the same reference numerals.

Detailed Description of the Invention

FIG. 1 shows a block diagram of one specific embodiment of a micromirror assembly 1 according to the present invention.

The micromirror assembly of FIG. 1 has a spring-mounted mirror 2 and a stop unit 3.

Stop unit 3 is designed in such a way that it restricts the movement of mirror 2 in a predefined direction 4 out of its idle position. This may be carried out, for example, in that stop unit 3 is situated at a suitable distance to mirror 2 and mirror 2 strikes against stop unit 3 during a movement in predefined direction 4 when it has covered the distance.

In one specific embodiment, the predefined direction may be the direction of normal vector 8 of the plane in which mirror 2 is situated in its idle position, i.e., in a non-excited or non-deflected state.

In FIG. 1, stop unit 3 is shown as an element separate from mirror 2. In other specific embodiments, stop unit 3 may also have at least two elements, one or multiple of the elements being able to be coupled to mirror 2. For example, stop unit 3 may have at least one stop 5-1- 5-6, which is coupled to mirror 2, and at least one counter bearing 7, which is coupled to a housing 6 of micromirror assembly 1. This will be explained in detail in the following figures.

FIG. 1 schematically shows a spring 18 above mirror 2 and stop unit 3 is situated below mirror 2. Spring 18 is only used to illustrate the spring mounting. In other specific embodiments, spring 18 may also include two or more springs. This is also explained in detail in the following figures.

Figure 2:
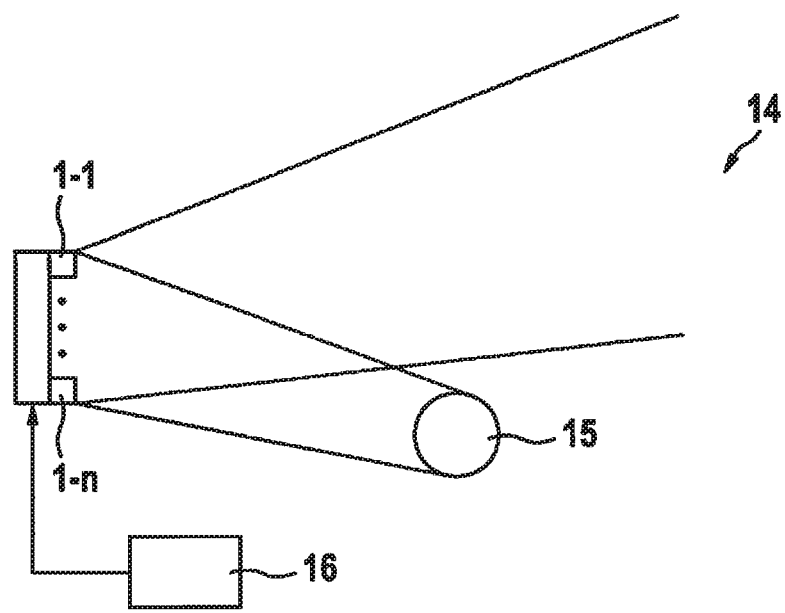
FIG. 2 shows a block diagram of one specific embodiment of a projection device according to the present invention.

FIG. 2 shows a block diagram of one specific embodiment of a projection device 14 according to the present invention.

Projection device 14 may be, for example, a video projector for projecting films or images on a screen. However, projection device 14 may also be a projection device which is used, for example, in an HUD display of a vehicle. Further embodiments are also possible.

Projection device 14 includes a light source 15, which may be, for example, a conventional lamp, an LED lamp, a laser light source, or the like. Light source 15 is situated in such a way that it illuminates an array of a plurality of micromirrors 1-1- 1-n (shown by dashed lines in FIG. 2). Individual micromirror devices 1-1- 1-n of the array reflect the light in the direction, for example, of a screen or the like (not shown separately in FIG. 2).

Projection device 14 furthermore includes a control unit 16, which controls micromirror devices 1-1-1-n. For this purpose, control unit 16, depending on the specific embodiment, may provide one or multiple control voltages, for example, which control the alignment of individual micromirror devices 1-1- 1-n. Control unit 16 may also be designed in one specific embodiment to control the light source. Furthermore, control unit 16 may also include an interface, via which control unit 16 may receive image data, for example. This interface may be, for example, an HDMI interface, a DVI interface, or the like. This interface may also be a network interface or the like, however.

Figure 3:
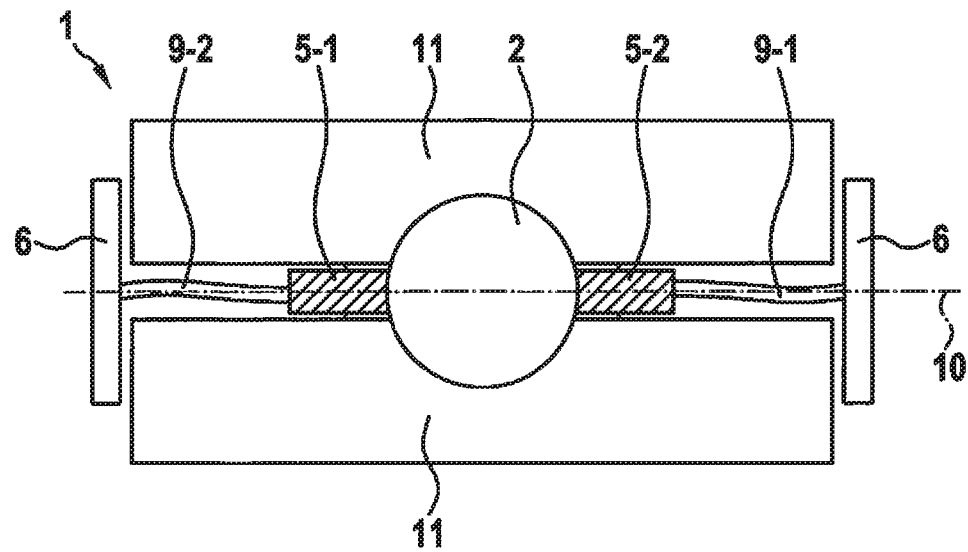
FIG. 3 shows a schematic view of one specific embodiment of a micromirror assembly according to the present invention.

FIG. 3 shows a schematic view of one specific embodiment of a micromirror assembly 1 according to the present invention in a top view onto the plane, in which mirror 2 is situated in its idle position.

Micromirror assembly 1 of FIG. 3 includes a mirror 2 in the center, which includes stops 5-1 and 5-2 situated laterally on mirror 2 in the horizontal direction. Furthermore, axis of rotation 10 of mirror 2 extends through the center of mirror 2 in the horizontal direction.

Furthermore, a drive frame 11 is visible indicated behind mirror 2, which has a gap in the center of mirror 2, where stops 5-1 and 5-2 are situated. In this gap, a torsion spring 9-1, 9-2 is situated on each side, which are each coupled to a housing 6 or a part of housing 6 of micromirror assembly 1. Torsion springs 9-1, 9-2 are coupled behind stops 5-1 and 5-2 to mirror 2, which is not visible, since the ends of torsion springs 9-1, 9-2 are concealed by stops 5-1 and 5-2. Torsion springs 9-1, 9-2 are used jointly together with drive frame 11 to drive and/or deflect mirror 2.

Micromirror assembly 1 of FIG. 3 is a quasistatic micromirror assembly 1, for the drive of which, for example, a Lorentz force may be exerted via a magnet on drive frame 11 when strip conductors on the drive frame are energized, whereby drive frame 11 and therefore also mirror 2 coupled thereto is rotated about the axis of rotation 10. Torsion springs 9-1, 9-2 are used as a counterforce to the force exerted on drive frame 11.

Figure 4:
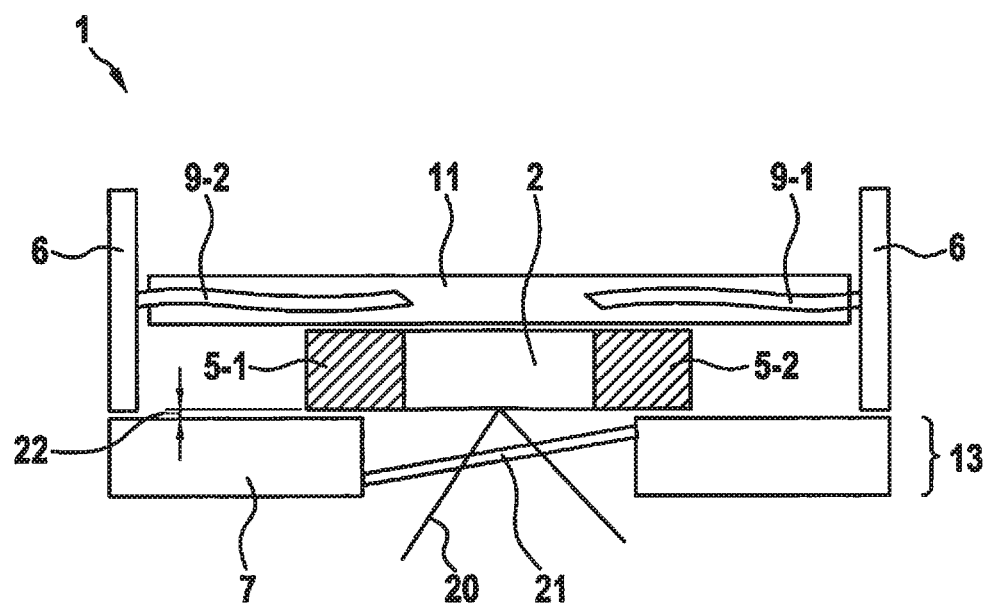
FIG. 4 shows a schematic view of another specific embodiment of a micromirror assembly according to the present invention.

FIG. 4 shows a schematic view of the specific embodiment of the micromirror assembly according to the present invention of FIG. 3 in a side view.

It is apparent in the side view that torsion springs 9-1, 9-2 are situated with drive frame 11 in a plane behind mirror 2 and stops 5-1, 5-2 are situated with the mirror in a shared plane. Torsion springs 9-1, 9-2 each extend from housing 6 up to the edge of mirror 2 into the recess (shown in FIG. 3) between the two halves of drive frame 11. The coupling of torsion springs 9-1, 9-2 to drive frame 11 or mirror 2 may be carried out in different ways. For example, all elements of micromirror assembly 1 may be formed in one piece from a single silicon substrate. This may be carried out, for example, by suitable etching processes.

FIG. 4 furthermore shows an optical base 13, which, between two base housing halves, which are used as counter bearing 7, has a glass pane 21, which is transparent to light or laser beams 20, for example, and at the same time protects mirror 2 from penetrating dust. It is clearly apparent in the side view of FIG. 4 that optical base 13 is situated below mirror 2 in such a way that mirror 2 or stops 5-1, 5-2 strikes or strike on counter bearing 7 during a movement of mirror 2 downward, which may be triggered by an impact, for example, after a predefined travel 22.

Predefined travel 22 may be 100 μm, for example. In other specific embodiments, the predefined travel is, for example, 50 μm or less than 50 μm.

In another specific embodiment, optical base 13 is situated flush with mirror 2 in one plane.

Predefined travel 22 may be set in such a specific embodiment, for example, by setting back stops 5-1, 5-2 by predefined travel 22 or by a recessing counter bearing 7 at the position of stops 5-1, 5-2 by predefined travel 22.

If springs 9-1, 9-2 are drawn below stops 5-1, 5-2 or even below mirror 2, the required clearance has to be provided by free etching between mirror 2 and springs 9-1, 9-2. The advantage of the arrangement having only one stop 5-1, 5-2 in each case directly in the axis of rotation is that the distance to counter bearing 7 may be laid out as minimal.

Figure 5:
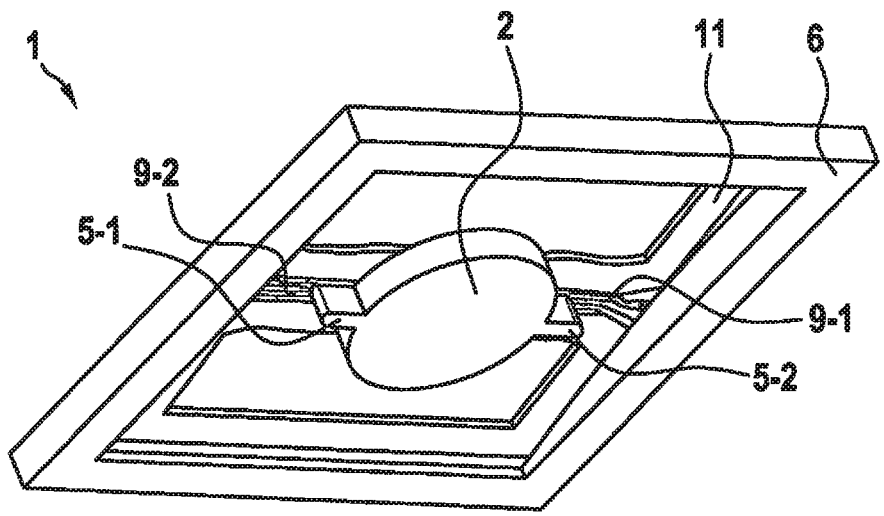
FIG. 5 shows a schematic view of another specific embodiment of a micromirror assembly according to the present invention.

FIG. 5 shows a schematic view of another specific embodiment of a micromirror assembly 1 according to the present invention.

Micromirror assembly 1 of FIG. 5 includes a rectangular housing 6 or a rectangular frame, which is a part of housing 6. Torsion springs 9-1, 9-2 are coupled to housing 6 in the middle of each of two opposing sides of housing 6 and extend up to the middle of the area within the frame up to mirror 2, which is situated therein. Torsion springs 9-1, 9-2 are each made of multiple spring webs extending adjacent to one another. Other specific embodiments of torsion springs 9-1, 9-2 are also possible.

Drive frame 11 has a rectangular frame part on each side of the torsion springs, which is fitted into the area defined by housing 6. In FIG. 5, the drive frame is visible in a slightly tilted position, whereby mirror 2 is tilted out of its idle position.

Furthermore, a stop 5-1, 5-2 is shown situated above torsion springs 9-1, 9-2 on mirror 2. If micromirror assembly 1 is manufactured in one piece from a single silicon substrate, a manufacturing step is necessary in which the connection between torsion springs 9-1, 9-2 and stop 5-1, 5-2 situated above torsion springs 9-1, 9-2 is separated in each case. This may be carried out, for example, by a suitable etching procedure.

Figure 6:
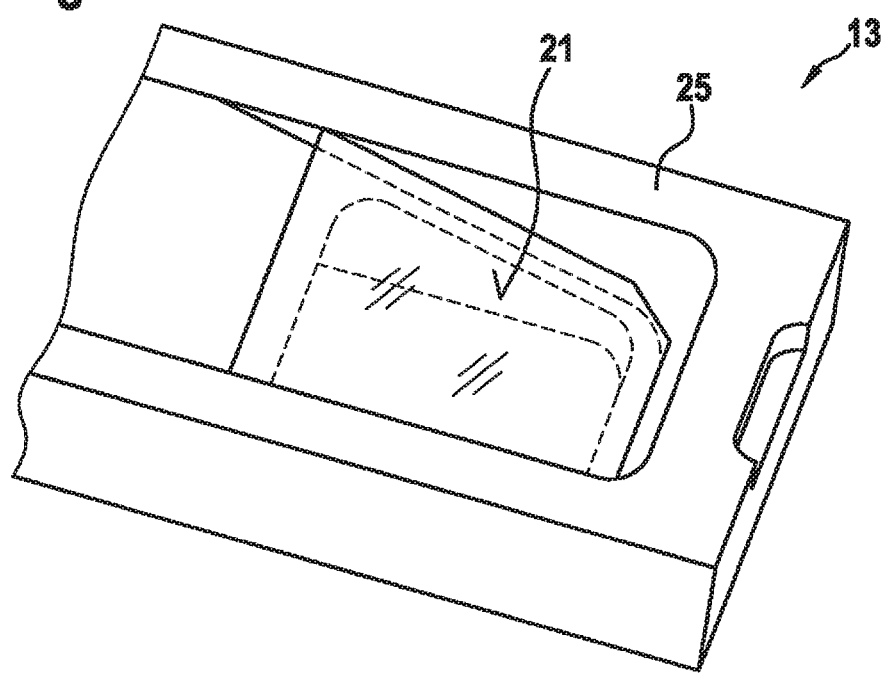
FIG. 6 shows a schematic view of one specific embodiment of an optical base.

FIG. 6 shows a schematic view of one specific embodiment of an optical base 13.

Optical base 13 of FIG. 6 has a rectangular base housing 25, into which a glass pane 21 is fitted, diagonally opposite to the plane in which mirror 2 is situated in the idle position. The inclined arrangement of glass pane 21 is used to avoid a reflection point in the projected image, in that the reflection point of the light or the laser beam which is to be guided by mirror 2 is blocked out from the image.

FIG. 7 shows a schematic view of another specific embodiment of a micromirror assembly 1 according to the present invention. Micromirror assembly 1 of FIG. 7 is based on micromirror assembly 1 of FIG. 5. In contrast to micromirror assembly 1 of FIG. 5, micromirror assembly 1 of FIG. 7 has, however, on each side of the mirror, two stops 5-3, 5-4 and 5-5, 5-6, which are each situated above rails 12-1, 12-2 of drive frame 11. Rails 12-1, 12-2 are each situated adjacent to torsion springs 9-1, 9-2 (not shown). If stops 5-3, 5-4 and 5-5, 5-6 are situated in the way shown in FIG. 7, micromirror device 1 may be produced very easily, since no separation has to be carried out between torsion springs 9-1, 9-2 and stops 5-3, 5-4 and 5-5, 5-6 situated above them. A somewhat greater distance to counter bearing 7 has to be provided in relation to the arrangement of FIG. 4.

FIG. 8 shows a schematic view of another specific embodiment of a micromirror assembly 1 according to the present invention. Micromirror assembly 1 of FIG. 8 represents a resonant micromirror assembly 1, in which only a part of the entire arrangement is shown. Springs 17, which are situated below mirror 2, form an oscillating spring-mass system together with the mirror mass, which is mechanically coupled, for example, to a second spring-mass system (not shown), into which the energy is coupled, so that the entire system made up of springs 17 and mirror 2 and the spring-mass system being excited is set into a resonant oscillation.

As is apparent in FIG. 8, in this micromirror assembly 1, stops 5-1 and 5-2 may also each be situated on the sides of mirror 2 and may thus protect it from destruction, for example, in the event of an impact.

Although the present invention was described above on the basis of preferred exemplary embodiments, it is not restricted thereto, but rather is modifiable in a variety of ways. In particular, the present invention may be changed or modified in manifold ways, and may also be used for gimbal-mounted mirrors, without departing from the core of the present invention.

What is claimed is:

1. A micromirror assembly, comprising:
    a spring-mounted mirror, wherein:
        a reflective exterior bottom surface of the spring-mounted mirror, when the spring-mounted mirror is in an idle position, extends in first and second directions in a plane; and
        the spring-mounted mirror is deflectable out of its idle position to move at least in a third direction that is perpendicular to the plane; and
    a stop unit arranged relative to the spring-mounted mirror so that the movement of the mirror in the third direction when deflected out of its idle position is restricted to a limiting distance, wherein the stop unit includes a plurality of stops that each (a) is at least one of in a same plane as and attached to the mirror and (b) extends longitudinally away from a lateral edge of the mirror in a direction that is parallel to an axis of rotation of the mirror.

2. The micromirror assembly as recited in claim 1, further comprising:
    a housing, wherein the stop unit includes at least one counter bearing that is coupled to the housing.

3. The micromirror assembly as recited in claim 1, further comprising:
    at least one torsion spring for spring-mounting the mirror, wherein the at least one torsion spring is situated in one of:
        the axis of rotation of the mirror, and
        a parallel axis that is parallel to the axis of rotation of the mirror and is above the mirror.

4. The micromirror assembly as recited in claim 3, wherein each of the plurality of stops is, in the third direction, at a predefined distance from the at least one torsion spring.

5. The micromirror assembly as recited in claim 3, further comprising:
    a drive frame that includes at least two rails sandwiching the at least one torsion spring and that is above the mirror, wherein:
        the plurality of stops include, on each of two opposite sides of the mirror, at least two respective stops that each extends longitudinally away from a respective lateral edge of the mirror in a respective direction that is parallel to the axis of rotation of the mirror on each side of the mirror;
        an axis of symmetry of the plurality of stops is parallel to the axis of rotation of the mirror; and
        each of the rails is mechanically coupled to at least two of the stops.

6. The micromirror assembly as recited in claim 2, wherein the plurality of stops are formed with the mirror in one piece from a substrate.

7. The micromirror assembly as recited in claim 6, wherein the substrate includes a silicon substrate.

8. The micromirror assembly as recited in claim 2, wherein the counter bearing is an optical base of the micromirror assembly.

9. The micromirror assembly as recited in claim 2, wherein the counter bearing is situated on the micromirror assembly in such a way that, when the mirror is in its idle position, a distance between the stops and the counter bearing in the third direction is less than 100 μm.

10. The micromirror assembly as recited in claim 2, wherein the counter bearing is situated on the micromirror assembly in such a way that, when the mirror is in its idle position, a distance between the stops and the counter bearing in the third direction is less than 50 μm.

11. The micromirror assembly as recited in claim 2, wherein:
    the counter bearing is situated on the micromirror assembly in such a way that the counter bearing and the mirror are situated flush in one plane; and
    the counter bearing includes, in an area of the stops, a recess with a thickness, in the third direction, of less than 100 μm.

12. The micromirror assembly as recited in claim 2, wherein:
    the counter bearing is situated on the micromirror assembly in such a way that the counter bearing and the mirror are situated flush in one plane; and
    the counter bearing includes, in an area of the stops, a recess with a thickness, in the third direction, of less than 50 μm.

13. The micromirror assembly as recited in claim 2, wherein:
    the plurality of stops are coupled to the mirror and are, in the third direction, set back from the reflective exterior surface of the mirror at a distance of less than 100 μm from the counter bearing when the mirror is in its idle position.

14. The micromirror assembly as recited in claim 2, wherein:
    the plurality of stops are coupled to the mirror and are, in the third direction, set back from the reflective exterior surface of the mirror at a distance of less than 50 μm from the counter bearing when the mirror is in its idle position.

15. A projection device, comprising:
    at least one light source;
    a micromirror assembly that includes:
        a spring-mounted mirror arranged to reflect light from the at least one light source, wherein:
            a reflective exterior bottom surface of the spring-mounted mirror, when the spring-mounted mirror is in an idle position, extends in first and second directions in a plane; and the spring-mounted mirror is deflectable out of its idle position to move at least in a third direction that is perpendicular to the plane; and a stop unit arranged relative to the spring-mounted mirror so that the movement of the mirror in the third direction when deflected out of its idle position is restricted to a limiting distance, wherein the stop unit includes a plurality of stops that each (a) is at least one of in a same plane as and attached to the mirror and (b) extends longitudinally away from a lateral edge of the mirror in a direction that is parallel to an axis of rotation of the mirror; and a control unit for controlling the at least one micromirror assembly.

16. The micromirror assembly as recited in claim 2, wherein, when the spring-mounted mirror is in its idle position, the counter bearing is, in the third direction, at a first distance from the plurality of stops, and the micromirror assembly is arranged so that the counter bearing can abut against at least one of the plurality of stops in the third direction in response to deflection of the spring-mounted mirror out of its idle position.

17. The micromirror assembly as recited in claim 2, wherein, when the spring-mounted mirror is in its idle position, a gap separates the counter bearing from the plurality of stops in the third direction, and the micromirror assembly is arranged for the gap to close and the counter bearing to abut against one or more of the plurality of stops in the third direction when the spring-mounted mirror is deflected out of its idle position.

18. The micromirror assembly as recited in claim 17, wherein the spring-mounted mirror is arranged to, when deflected out of its idle position, rotate about the axis of rotation, which extends in one of the first and second directions so that opposite edges of the spring-mounted mirror deflect in opposite directions, perpendicularly to the first and second directions.

19. A micromirror assembly comprising:

a spring-mounted mirror, wherein:
   a reflective exterior surface of the spring-mounted mirror, when the spring-mounted mirror is in an idle position, extends in first and second directions in a plane; and
   the spring-mounted mirror is deflectable out of its idle position to move at least in a third direction that is perpendicular to the plane;

a frame that (a) is arranged relative to the mirror so that the movement of the mirror in the third direction when deflected out of its idle position is restricted to a limiting distance, (b) extends in parallel to the first and second directions and (c) includes a recess; and within the recess, a transparent pane, at least a part of which is arranged under the mirror and an exterior surface of which extends obliquely to the first and second directions.

20. The micromirror assembly as recited in claim 4, wherein at least a part of the at least one torsion spring is, in the third direction, arranged over the plurality of stops.

\* \* \* \* \*